United States Patent [19]

Hoer et al.

[11] 4,001,681
[45] Jan. 4, 1977

[54] VECTOR VOLTMETER

[75] Inventors: Cletus A. Hoer; Glenn F. Engen, both of Boulder, Colo.

[73] Assignee: The United States of America as represented by the Secretary of the Air Force, Washington, D.C.

[22] Filed: Jan. 28, 1976

[21] Appl. No.: 652,957

[52] U.S. Cl. .............................. 324/83 R; 324/114; 324/140 R
[51] Int. Cl.[2] ........................................ G01R 25/00
[58] Field of Search ................. 324/83 R, 83 A, 84, 324/95, 114, 140 R, 141

[56] References Cited

UNITED STATES PATENTS 3,083,336   3/1963   Poirier ............................ 324/83 A Primary Examiner—Robert Segal
Assistant Examiner—Michael J. Tokar
Attorney, Agent, or Firm—Joseph E. Rusz; Julian L. Siegel

[57] ABSTRACT

A vector voltmeter for measuring the amplitude and phase difference between two signals. A first signal is fed to a power divider in which one of its outputs is measured with a power detector and the other output is fed to a second divider, each output thereof being fed one each to a third and fourth power divider. The second signal is fed to a fifth power divider in which one of its outputs is measured by a second power detector and the other output of the fifth divider is fed to a hybrid circuit having quadrature outputs, one of which is fed to the third power divider whose output is measured by a third power detector and the other quadrature output is fed to the fourth power divider whose output is measured by a fourth power detector. The four power detectors are connected to two differential amplifiers which drive the X and Y axis of an oscilloscope.

7 Claims, 4 Drawing Figures

VECTOR VOLTMETER

STATEMENT OF GOVERNMENT INTEREST

The invention described herein may be manufactured and used by or for the Government for governmental purposes without the payment of any royalty thereon.

BACKGROUND OF THE INVENTION

This invention relates to electrical signal measurement, and more particularly to vector voltmeters.

The present invention can measure the complex voltage ratio of two sinusoidal signals having the same frequency in any part of the electromagnetic spectrum in which single-mode guided wave propagation is feasible. It is similar to existing vector voltmeters in that it measures the amplitude of both signals and the phase angle between them. However, it differs from prior vector voltmeters and most other phase measuring instruments in that the phase angle is obtained from four simple amplitude detectors rather than from more complicated schemes such as heterodyning the signal down to a lower frequency where the phase angle is measured directly using zero-crossing or other techniques. The six-port approach eliminates timing problems associated with zero-crossing techniques, and simplifies the measurement by not using heterodyne techniques (which usually require two separate sources).

SUMMARY OF THE INVENTION

The six-port vector voltmeter can be constructed from commercially available, nonprecision components. No phase-locked sources are required, no frequency conversion is needed. The six-port (or eight-port) can be described by exact circuit models yielding simple equations. Because of the simple, exact circuit model, the six-port vector voltmeter can be made self-calibrating because no standards are required to calibrate it for ratio measurements.

Phase information is obtained from amplitude (e.g., power measurements). Previously, circuits for obtaining accurate phase information from amplitude measurements were limited to the audio frequency range.

Accuracy is primarily a function of the linearity of the power detectors. Departures from linearity can readily be determined and corrected for at the frequency of interest. An experimental vector voltmeter used at X-band (8–12 GHz) had greater ratio accuracy than commercial vector voltmeters have at much lower frequencies.

The concept of the invention is valid at all frequencies where single modes can be maintained. Commercial vector voltmeters operate at frequencies up to 2.5 GHz at most. Systems capable of measuring phase above 2.5 GHz are costly and complicated. The six-port can be constructed from commercially available components up to at least 100 GHz, and probably into the optical range.

It is therefore an object of this invention to provide a novel and improved microwave calibration system.

It is another object to provide a method and system of measuring complex amplitudes for determining insertion losses.

It is still another object to provide a system that can calibrate attenuators, directional couplers, terminations, detectors, isolators, filters, and antennas.

It is yet another object to provide a method and system for measuring a phase angle between two signals without complicated schemes such as heterodyning and using zero-crossing detectors.

These and other objects, features and advantages of the invention will become more apparent from the following description when taken in conjunction with the illustrative embodiment in the accompanying drawings.

DESCRIPTION OF THE DRAWINGS

FIG. 2b is a block diagram showing the display system used with the embodiment of FIG. 2a.

DETAILED DESCRIPTION OF THE PREFERRED EMBODIMENT

Figure 1A:
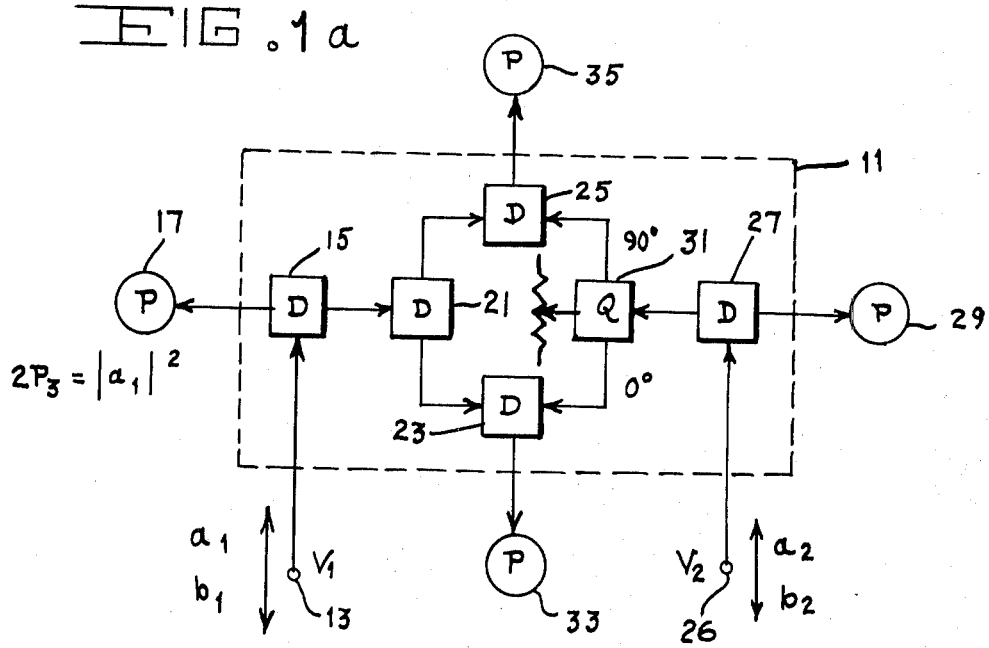
FIG. 1a is a block diagram showing a six-port embodiment of the vector voltmeter.
Figure 1B:
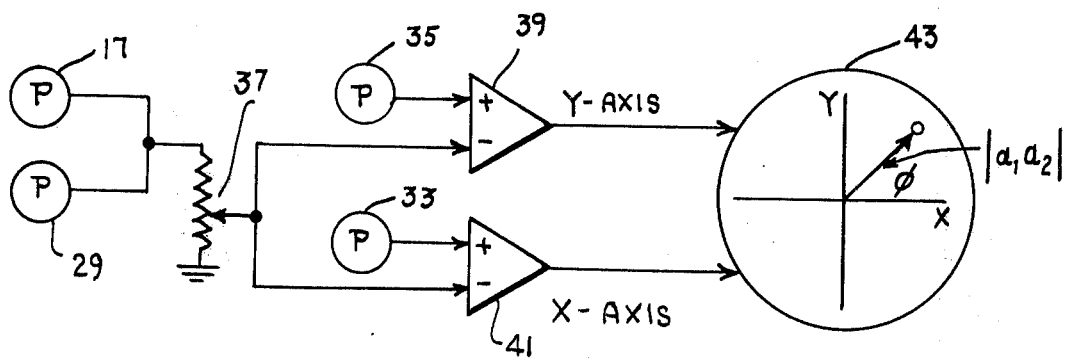
FIG. 1b is a block diagram showing the display system used with the embodiment of FIG. 1b.

The six-port vector voltmeter circuit as shown in FIGS. 1a and 1b uses five power dividers, one quadrature hybrid and four power detectors. The phase angle $\theta$ between two input signals $a_1$ and $a_2$ is obtained from the following equations:

$$2 \, |a_1 a_2| \cos \phi = |a_1 + a_2|^2 - |a_1|^2 - |a_2|^2 \qquad (1)$$

$$2 \, |a_1 a_2| \sin \phi = |a_1 - j a_2|^2 - |a_1|^2 - |a_2|^2. \qquad (2)$$

In terms of the four power readings, the amplitude and phase information is obtained from $$|a_1|^2 = 2 \, P_3 \qquad (3)$$

$$|a_2|^2 = 2 \, P_4 \qquad (4)$$

$$|a_1 a_2| \cos \phi = 4 \, P_5 - P_3 - P_4 \qquad (5)$$

$$|a_1 a_2| \sin \phi = 4 \, P_6 - P_3 - P_4 \qquad (6)$$

Referring to FIG. 1a, there is shown six-port vector voltmeter 11 in which a pair of signals having a phase difference are applied. The signals $v_1$ and $v_2$ consist of emergent components $a_1$ and $a_2$ and reflected components $b_1$ and $b_2$ such that $v_1 = a_1 + b_1$ and $v_2 = a_2 + b_2$. $A_1$ is applied at port 13 and is divided by power divider 15 where one-half of the signal is fed to power meter 17 and measures $|a_1|^{2/2}$. The other half of the signal from divider 15 is fed to divider 21 where it is again divided into two parts and fed to dividers 23 and 25. The signal $a_2$ is applied at port 26 and is fed to divider 27 where one-half of it is fed to power meter 29 which measures $|a_2|^{2/2}$. Divider 27 feeds the other half of $a_2$ to hybrid quadrature circuit 31 which has a 90° output and a zero degree output. The zero degree output is fed to divider 23 and is the output from divider 21 and the output of divider 23 is fed to power meter 33 which measures $|a_1 + a_2|^{2/8}$. The 90° output of quadrature circuit 27 is fed to divider 25 with the output of divider 21. The divided output of divider 25 is fed to power meter 35 which measures $|a_1 - j a_2|^{2/8}$.

An important advantage of this six-port vector voltmeter over prior vector voltmeters is that precision components are not required to obtain accurate amplitude and phase measurements. If the components used are not ideal, the information about $a_1$ and $a_2$ can still be accurately obtained from the four power readings.

Any linear six-port device with four linearly independent output signals, equations (3) through (6) becomes $$|a_1|^2 = \Sigma \alpha_i P_i \quad (7)$$

$$|a_2|^2 = \Sigma \beta_i P_i \quad i = 3 \ldots 6 \quad (8)$$

$$|a_1 a_2| \cos \phi = \Sigma \gamma_i P_i \quad (9)$$

$$|a_1 a_2| \sin \phi = \Sigma_i P_i \quad (10)$$

where each sum is over the four power readings. The Greek letters are real constants which depend on the configuration of the six-port and the impedance of the four detectors. If the components in FIG. 1a are ideal, the constants in Equations (7) through (10) reduce to the integers in Equations (3) through (6). If the components are nearly ideal, the constants in Equations (7) through (10) differ only slightly from those in Equations (3) through (6). These constants can be determined without any knowledge of the contents of the six-port or the impedance of the four detectors. Because the constants of the six-port vector voltmeter design have the last two properties mentioned, one can use nonprecision components with no significant loss in accuracy.

If the power detectors each have an output voltage in proportion to the input RF power, the displaying apparatus as shown in FIG. 1b can be used to display a point whose distance from the origin is $|a_1 a_2|$ at an angle $\phi$, the phase angle between $a_1$ and $a_2$. Power meters 17 and 29 are connected to potentiometer 37 which is used for adjustment. Potentiometer 37 connects to the minus input terminal of differential amplifier 39 which has the positive terminal connected to power detector 35. Potentiometer 37 is also connected to the negative input terminal of differential amplifier 41 which has the positive input terminal connected to power meter 33. Amplifier 39 drives the Y axis and amplifier 41 drives the X axis of oscilloscope 43.

Figure 2A:
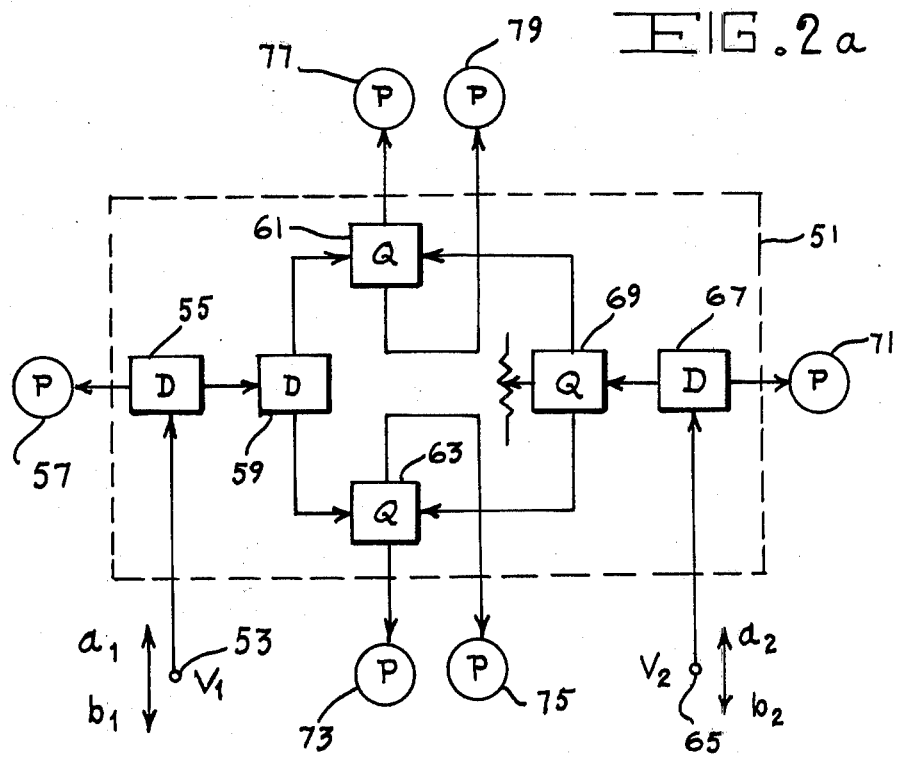
FIG. 2a is a block diagram showing an eight-port embodiment of the vector voltmeter.

A correlator or vector detector which are examples of past vector voltmeters can be converted to an equivalent of the six-port vector voltmeter by adding two power dividers. This variation, a second embodiment of the invention, is shown in FIG. 2a and is an eight-port vector voltmeter. Signal $a_1$ is applied at port 53 of vector voltmeter 51 and divided by power divider 55 which is connected to power detector 57 that measures $|a_1|^{2/2}$. The output of power divider 55 is fed to power divider 59 which divides the signal and sends it to the two hybrid quadrature circuits 61 and 63. Signal $a_2$ is applied at point 65 to divider 67 which divides the signal and sends it to hybrid quadrature circuit 69 and power meter 71 which measures $|a_2|^{2/2}$. Hybrid quadrature circuit 69 feeds one of its output signals to hybrid quadrature circuit 63 which is also fed by power divider 59. Hybrid quadrature circuit 63 has two outputs, one connected to power meter 73 that measures $|a_1 + a_2|^{2/8}$ and the other to power detector 75 that measures $|a_1 - a_2|^{2/8}$. Hybrid quadrature circuit 61 is fed by hybrid quadrature circuit 69 and power divider 59 and has two outputs. One is fed to power detector 77 that measures $|a_1 - ja_2|^{2/8}$ and the other output is fed to power meter 79 that measures $|a_1 + ja_2|^{2/8}$. Hybrid quadrature circuits 61 and 63 can be replaced with 180° hybrids to obtain the same said six outputs in terms of the two input signals $a_1$ and $a_2$.

Figure 2B:
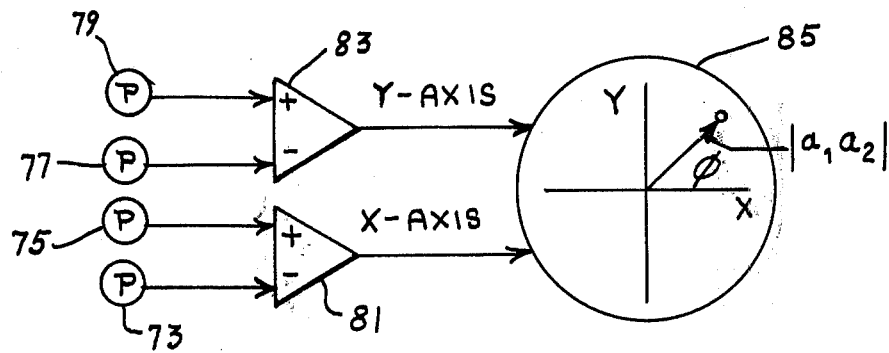

FIG. 2b shows the display used with vector voltmeter 51 of FIG. 2a. Power detectors 73 and 75 are connected to differential amplifier 81 while power detectors 77 and 79 are connected to differential amplifier 83. Oscilloscope 85 is connected to amplifier 81 which drives the X axis and amplifier 83 which drives the Y axis.

Discarding outputs from power meters 75 and 79, a six-port device is realized with essentially the same four outputs as in FIG. 1a. For the eight-port device in FIG. 2a, any combination of power meters 57 or 71 plus meters 73 or 75, plus meters 77 or 79, plus any detector that has not yet been used, make up a set of four linearly independent outputs for which equations (7) through (10) do apply, having constants which are well behaved.

Either the six-port vector voltmeter in FIGS. 1a and 1b or the eight-port vector voltmeter in FIGS. 2a and FIG. 2b can be used to display the approximate phase angle on an oscilloscope as well as to accurately calculate the phase, amplitudes, and ratio of the two input signals.

What is claimed is:

1. A vector voltmeter for measuring first and second signals comprising:
   a. a first power divider connected to the first signal;
   b. a first power detector fed by the first power divider;
   c. a second power divider fed by the second signal;
   d. a second power detector fed by the second power divider;
   e. a third power divider fed by the first power divider;
   f. a hybrid quadrature circuit fed by the second power divider and having a 0° phase output and a 90° phase output;
   g. a fourth power divider fed by the third power divider and the 0° phase output of the hybrid quadrature circuit;
   h. a third power detector fed by the fourth power divider;
   i. a fifth power divider fed by the third power divider and the 90° output of the hybrid quadrature circuit; and
   j. a fourth power detector fed by the fifth power divider.

2. A vector voltmeter according to claim 1 wherein the first and second power meters are connected to a first common point and the vector voltmeter further comprises:
   a. a first differential amplifier having first and second inputs with the third power meter connected to the first input;
   b. a second differential amplifier having first and second inputs with the fourth power meter connected to the first input and with the second inputs of the first and second differential amplifiers being connected to a second common point, the first and second common points being connected together; and
   c. an oscilloscope having X and Y inputs connected to the first and second differential amplifiers.

3. A vector voltmeter according to claim 2 which further comprises a potentiometer interposed between the first and second common points.

4. A vector voltmeter for measuring first and second signals comprising:
   a. a first power divider fed by the first signal;
   b. a first power detector fed by the first power divider;
   c. a second power divider fed by the first power divider;

d. a third power divider fed by the second signal;

e. a second power detector fed by the third power divider;

f. a quadrature hybrid circuit fed by the third power divider;

g. a first phase hybrid circuit having first and second outputs fed by the quadrature hybrid circuit and the second power divider;

h. third and fourth power detectors connected one each to first and second outputs of the first phase hybrid circuit;

i. a second phase hybrid circuit having first and second outputs fed by the quadrature hybrid and the second power divider; and j. fifth and sixth power detectors connected one each to the first and second outputs of the second phase hybrid circuit.

5. A vector voltmeter according to claim 4 which further comprises:

a. a first differential amplifier connected to the third and fourth power detectors;

b. a second differential amplifier connected to the fourth and fifth power detectors; and c. an oscilloscope having X and Y inputs connected to the first and second differential amplifiers.

6. A vector voltmeter according to claim 5 wherein the first and second phase hybrid circuits have quadrature outputs.

7. A vector voltmeter according to claim 5 wherein the first and second phase hybrid circuits have 180° outputs.

* * * * *